(12) United States Patent
Tang et al.

(10) Patent No.: US 6,936,507 B2
(45) Date of Patent: Aug. 30, 2005

(54) METHOD OF FORMING FIELD EFFECT TRANSISTORS

(75) Inventors: Sanh D. Tang, Boise, ID (US); Michael P. Violette, Boise, ID (US); Robert Burke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/001,145

(22) Filed: Nov. 30, 2004

(65) Prior Publication Data

US 2005/0095767 A1    May 5, 2005

Related U.S. Application Data

(62) Division of application No. 10/222,326, filed on Aug. 15, 2002.

(51) Int. Cl.[7] ......................................... H01L 21/8234
(52) U.S. Cl. ..................... 438/197; 438/300; 438/586; 438/589
(58) Field of Search .............................. 438/300, 197, 438/200, 270, 279, 290, 299, 430, 443, 585, 438/586, 587, 588, 592, 595, 589

(56) References Cited

U.S. PATENT DOCUMENTS

| | | | |
|---|---|---|---|
| 4,829,018 A | 5/1989 | Wahlstrom | |
| 5,308,782 A | 5/1994 | Mazure et al. | 438/154 |
| 5,312,782 A | 5/1994 | Miyazawa | |
| 5,340,754 A | 8/1994 | Witek et al. | 438/156 |
| 5,736,435 A | 4/1998 | Venkatesan et al. | |
| 5,760,442 A | 6/1998 | Shigyo et al. | |
| 5,908,313 A | 6/1999 | Chau et al. | |
| 5,943,575 A | 8/1999 | Chung | 438/300 |
| 5,972,758 A | 10/1999 | Liang | |
| 6,027,975 A | 2/2000 | Hergenrother et al. | |
| 6,054,355 A | 4/2000 | Inumiya et al. | |
| 6,156,589 A | 12/2000 | Noble | |
| 6,174,754 B1 | 1/2001 | Lee et al. | |
| 6,180,494 B1 | 1/2001 | Manning | |
| 6,204,138 B1 | 3/2001 | Krishnan et al. | |
| 6,229,187 B1 | 5/2001 | Ju | |
| 6,245,636 B1 | 6/2001 | Maszara | |
| 6,261,878 B1 | 7/2001 | Doyle et al. | |
| 6,274,913 B1 | 8/2001 | Brigham et al. | |

(Continued)

OTHER PUBLICATIONS

Wolf et al., Silicon Epitaxial Film Growth, 1 Silicon Processing for the VLSI Era—Process Technology, pp. 124-160 (Lattice Press 1986).

(Continued)

Primary Examiner—Jack Chen
(74) Attorney, Agent, or Firm—Wells St. John P.S.

(57) ABSTRACT

In one implementation, a method of forming a field effect transistor includes etching an opening into source/drain area of a semiconductor substrate. The opening has a base comprising semiconductive material. After the etching, insulative material is formed within the opening over the semiconductive material base. The insulative material less than completely fills the opening and has a substantially uniform thickness across the opening. Semiconductive source/drain material is formed within the opening over the insulative material within the opening. A transistor gate is provided operatively proximate the semiconductive source/drain material. Other aspects and implementations are contemplated.

9 Claims, 7 Drawing Sheets

U.S. PATENT DOCUMENTS

| | | |
|---|---|---|
| 6,300,199 B1 | 10/2001 | Reinberg |
| 6,300,219 B1 | 10/2001 | Doan et al. |
| 6,358,798 B1 | 3/2002 | Chen |
| 6,372,562 B1 | 4/2002 | Matsumoto |
| 6,376,286 B1 | 4/2002 | Ju |
| 6,388,294 B1 | 5/2002 | Radens et al. |
| 6,391,726 B1 | 5/2002 | Manning |
| 6,420,767 B1 | 7/2002 | Krishnan et al. |
| 6,424,011 B1 | 7/2002 | Assaderaghi et al. |
| 6,465,852 B1 | 10/2002 | Ju |
| 6,479,866 B1 | 11/2002 | Xiang |
| 6,514,809 B1 | 2/2003 | Xiang |
| 6,544,874 B2 * | 4/2003 | Mandelman et al. ....... 438/589 |
| 6,599,789 B1 | 7/2003 | Abbott et al. |
| 6,617,202 B2 | 9/2003 | Lee ........................... 438/149 |
| 6,649,460 B2 | 11/2003 | Leobandung ............... 438/183 |
| 6,716,687 B2 | 4/2004 | Wang et al. |

OTHER PUBLICATIONS

U.S. Appl. No. 10/236,282, filed Sep. 2002, Abbott et al.
U.S. Appl. No. 10/236,662, filed Sep. 2002, Abbott et al.

* cited by examiner

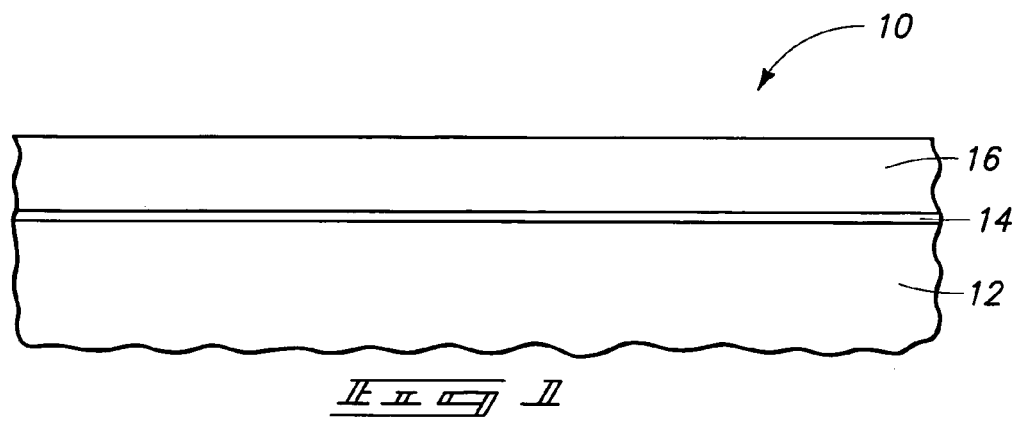
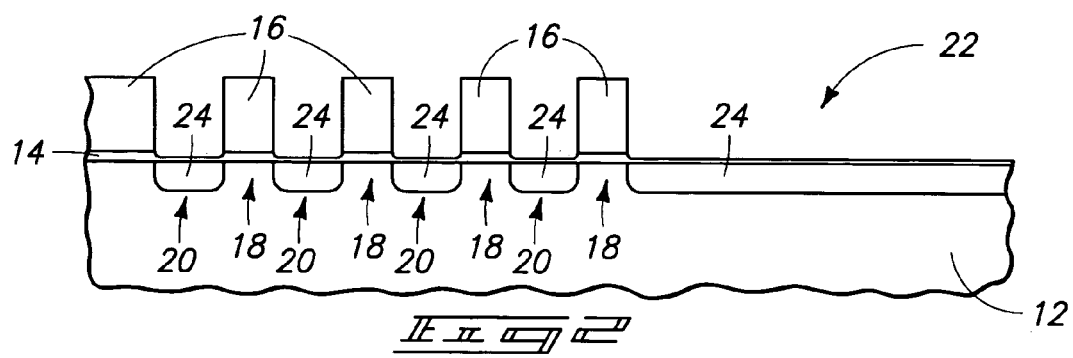
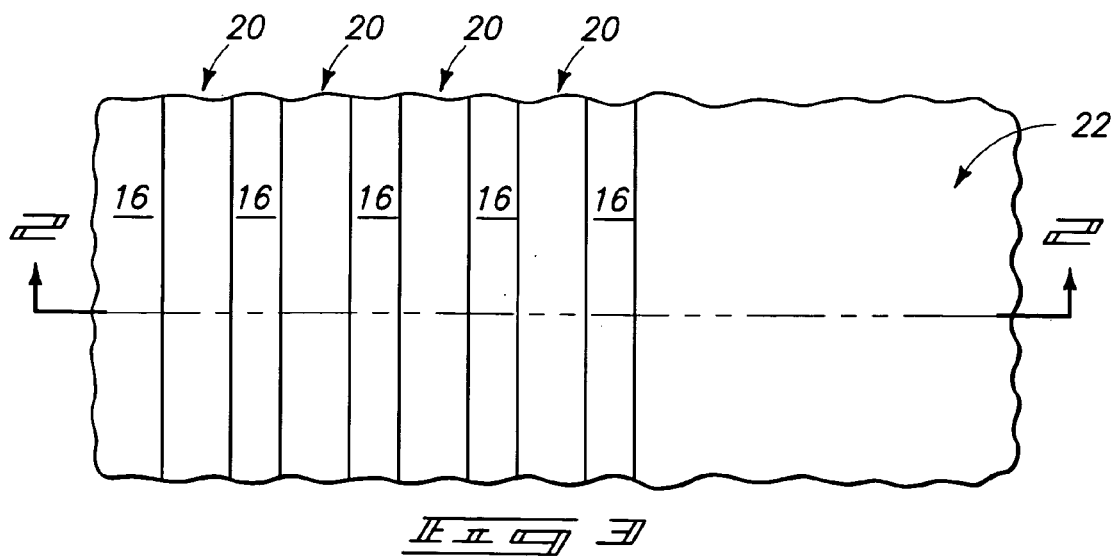

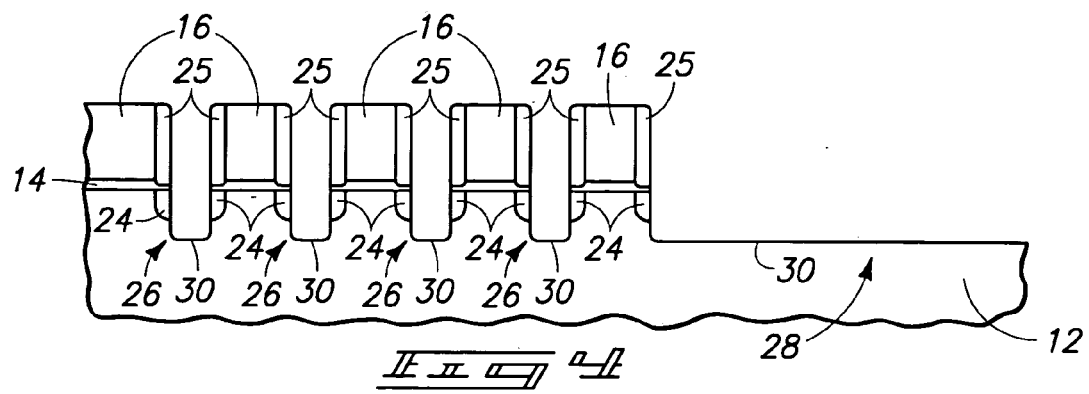
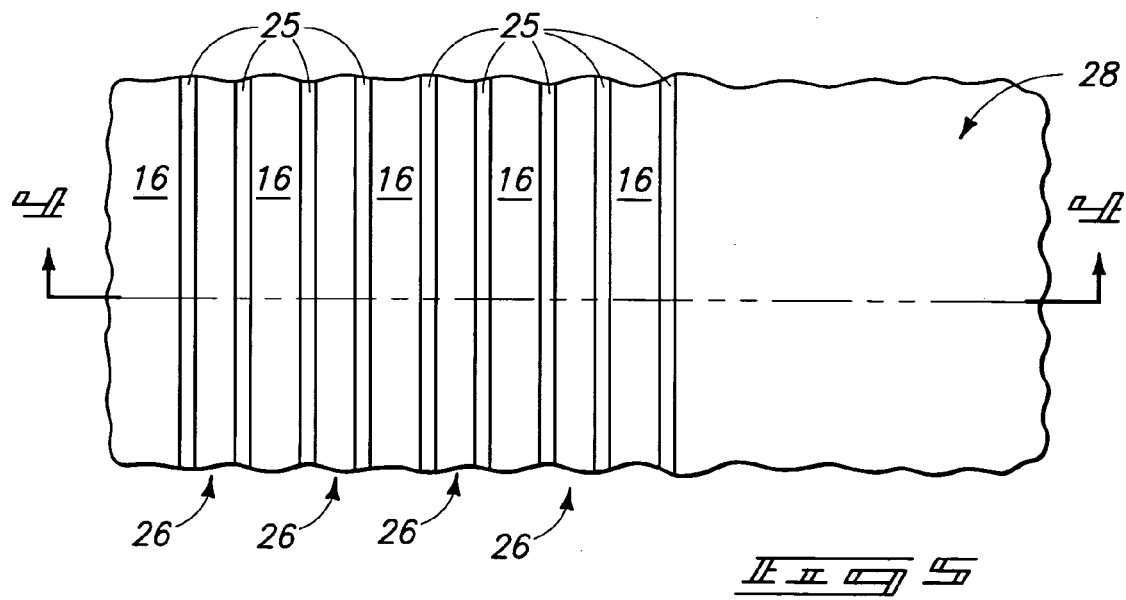
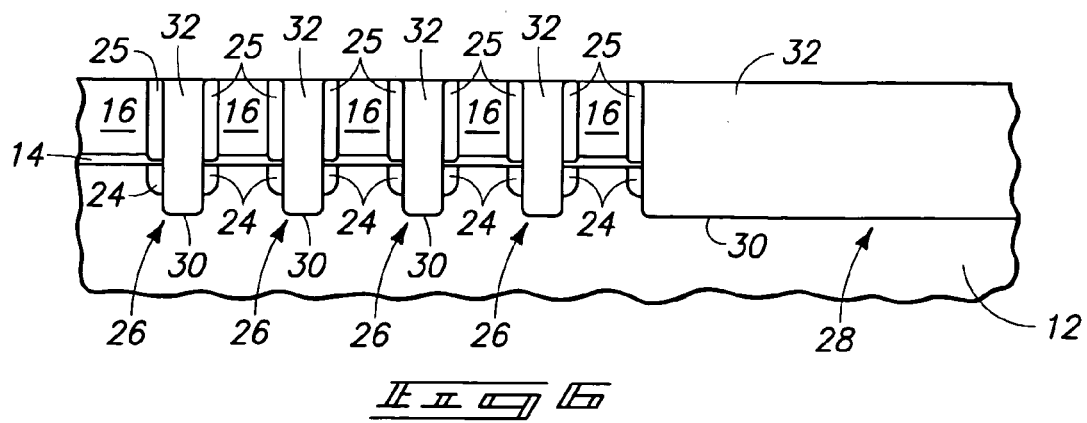

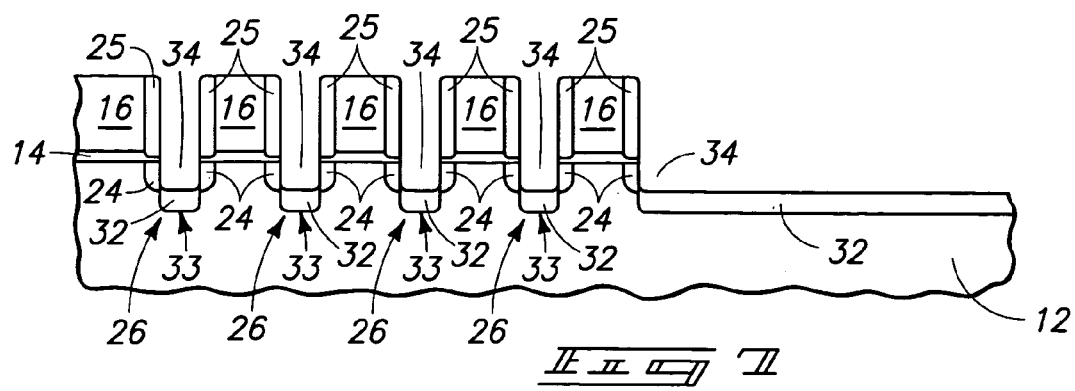
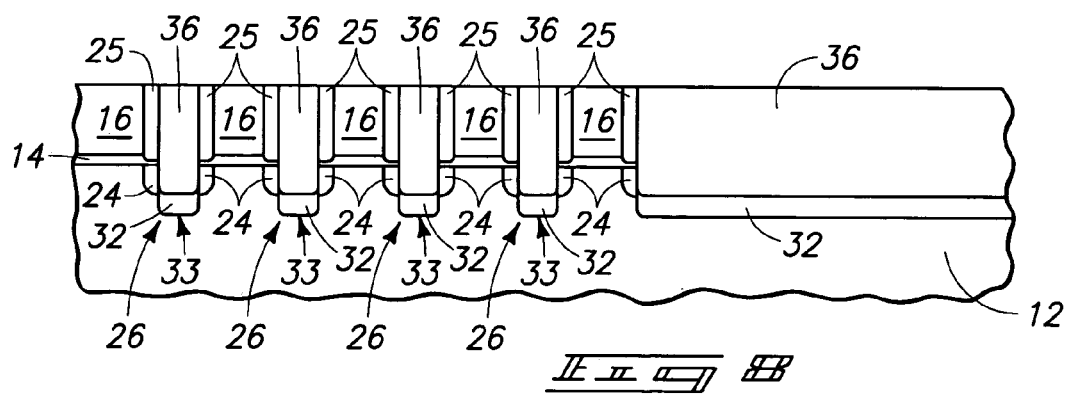
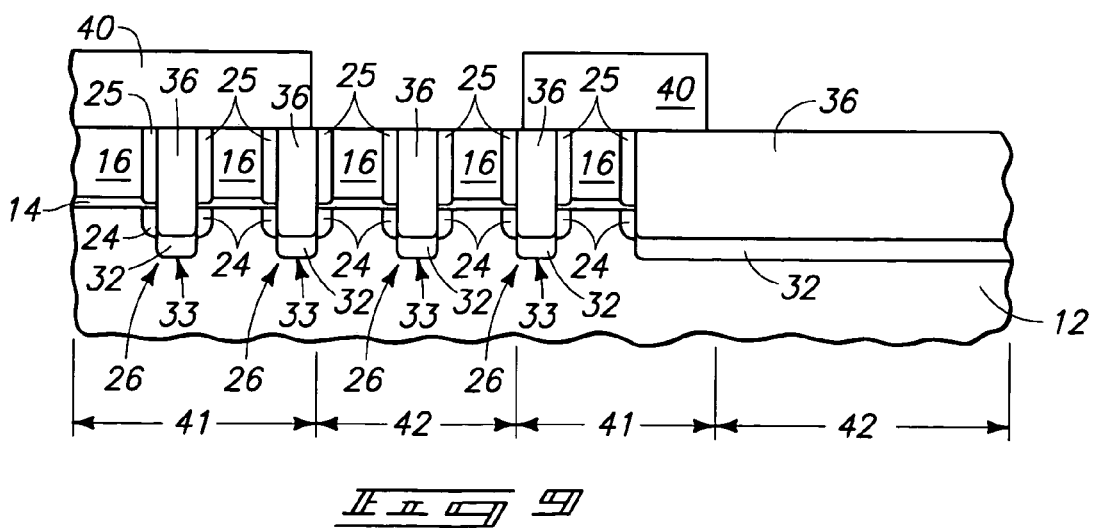

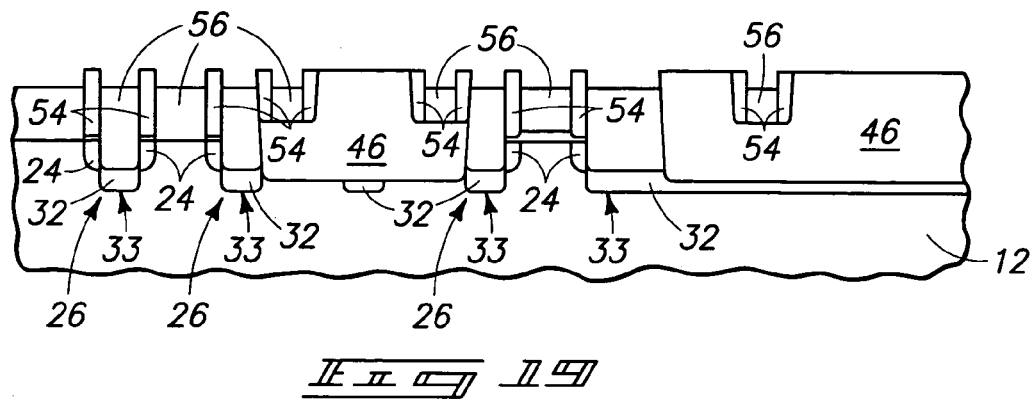
_FIG 19_
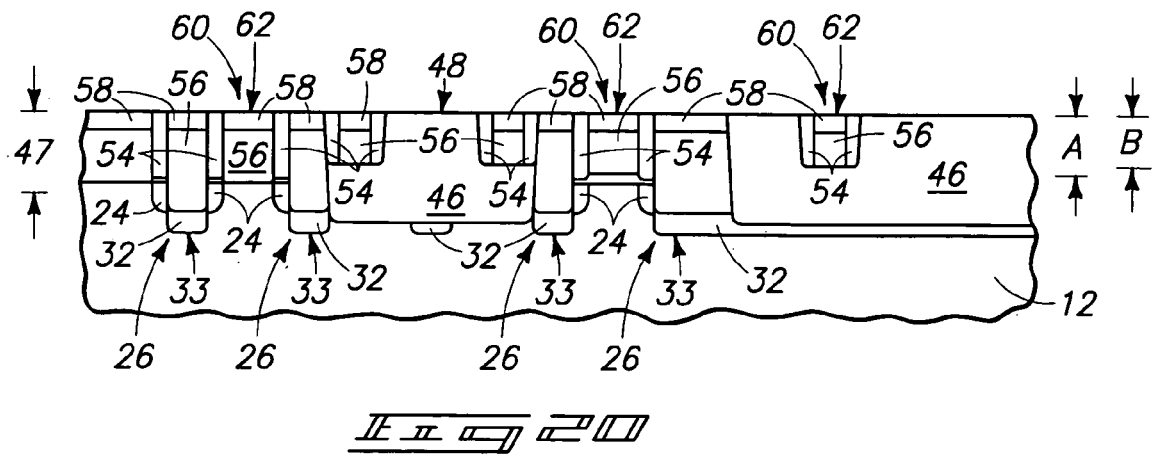
_FIG 20_

METHOD OF FORMING FIELD EFFECT TRANSISTORS

RELATED PATENT DATA

This patent resulted from a divisional application of U.S. patent application Ser. No. 10/222,326, filed Aug. 15, 2002, entitled "Method of Forming a Field Effect Transistor", naming Sanh D. Tang, Michael P. Violette and Robert Burke as inventors, the disclosure of which is incorporated herein by reference.

TECHNICAL FIELD

This invention relates to methods of forming field effect transistors, and to methods of forming field effect transistor gates and gate lines.

BACKGROUND OF THE INVENTION

Semiconductor processors continue to strive to reduce the size of individual electronic components, thereby enabling smaller and denser integrated circuitry. One typical circuitry device is a field effect transistor. Typically, such includes opposing semiconductive source/drain regions of one conductivity type having a semiconductive channel region of opposite conductivity type therebetween. A gate construction is received over the channel region. Such includes a conductive region having a thin dielectric layer positioned between the conductive region and the channel region. Current can be caused to flow between the source/drain regions through the channel region by applying a suitable voltage to the gate.

In some cases, the channel region is composed of a background doped semiconductive substrate, including doped well material thereof, which is also received immediately beneath the opposite type doped source/drain regions. This results in a parasitic capacitance developing between the bulk substrate/well and the source/drain regions. This can adversely affect speed and device operation, and becomes an increasingly adverse factor as device dimensions continue to decrease. Further adverse factors associated with smaller and denser field effect transistor fabrication include source/drain leakage to the substrate, conducting etch stops on very thin gate dielectric layers, and forming contacts with multi-level alignment.

While the invention was motivated in addressing the above issues, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming field effect transistors and methods of forming field effect transistor gates and gate lines. In one implementation, a method of forming a field effect transistor includes etching an opening into source/drain area of a semiconductor substrate. The opening has a base comprising semiconductive material. After the etching, insulative material is formed within the opening over the semiconductive material base. The insulative material less than completely fills the opening and has a substantially uniform thickness across the opening. Semiconductive source/drain material is formed within the opening over the insulative material within the opening. A transistor gate is provided operatively proximate the semiconductive source/drain material.

In one implementation, a method of forming a field effect transistor having a conductive gate received over a gate dielectric and having lightly doped drain regions formed within semiconductive material includes doping the semiconductive material effective to form the lightly doped drain regions prior to forming any conductive gate material for the transistor gate.

In one implementation, a method of forming a field effect transistor having a conductive gate received over a gate dielectric and having lightly doped drain regions formed within semiconductive material includes doping the semiconductive material effective to form the lightly doped drain regions prior to forming any gate dielectric material for the transistor gate.

In one implementation, a method of forming field effect transistor gate lines over a semiconductor substrate includes forming active area and field isolation trenches within semiconductive material of a semiconductor substrate. Trench isolation material is deposited over the substrate within the trenches. The trench isolation material includes portions that project outwardly of the isolation trenches. A plurality of gate line trenches are etched into at least those portions of the trench isolation material that project outwardly of the isolation trenches. Conductive gate material is formed within the gate line trenches and over the active area.

In one implementation, a method of forming a field effect transistor gate over a semiconductor substrate includes forming an active area and a field isolation trench within semiconductive material of a semiconductor substrate. Trench isolation material is deposited over the substrate within the trench. The trench isolation material includes a portion that projects outwardly of the isolation trench. The portion has an outermost planar surface. A transistor gate construction if formed operably over the active area. The gate construction includes conductive material having an outermost planar surface at least over said active area and which is coplanar with that of the trench isolation material.

In one implementation, a method of forming a field effect transistor having elevated source/drains on a substrate constituting part of a final circuit construction includes forming elevated source/drain material of the transistor prior to depositing an outermost portion of trench isolation material received within an isolation trench and constituting a portion of the final circuit construction.

In one implementation, a method of forming a field effect transistor having elevated source/drains on a substrate includes forming elevated source/drain material of the transistor prior to final patterning which defines outlines of the active area and field isolation.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that shown by FIG. 1.

FIG. 3 is a top view of the FIG. 2 wafer fragment.

FIG. 4 is a view of the FIG. 2 wafer fragment at a processing step subsequent to that shown by FIG. 2.

FIG. 5 is a top view of the FIG. 4 wafer fragment.

FIG. 6 is a view of the FIG. 4 wafer fragment at a processing step subsequent to that shown by FIG. 4.

FIG. 7 is a view of the FIG. 6 wafer fragment at a processing step subsequent to that shown by FIG. 6.

FIG. 8 is a view of the FIG. 7 wafer fragment at a processing step subsequent to that shown by FIG. 7.

FIG. 9 is a view of the FIG. 8 wafer fragment at a processing step subsequent to that shown by FIG. 8.

FIG. 19 is a view of the FIG. 18 wafer fragment at a processing step subsequent to that shown by FIG. 18.

FIG. 20 is a view of the FIG. 19 wafer fragment at a processing step subsequent to that shown by FIG. 19.

DETAILED DESCRIPTION OF THE PREFERRED EMBODIMENTS

Figure 10:
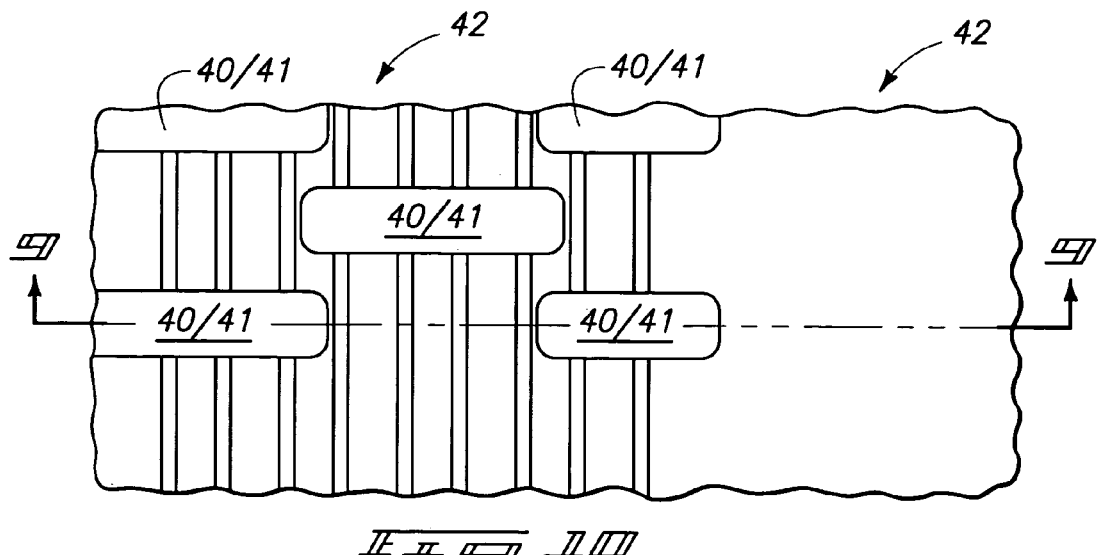
FIG. 10 is a top view of the FIG. 9 wafer fragment.

This disclosure of the invention is submitted in furtherance of the constitutional purposes of the U.S. Patent Laws "to promote the progress of science and useful arts" (Article 1, Section 8).

Preferred methods of forming field effect transistors are described with reference to FIGS. 1–20. FIG. 1 depicts a semiconductor substrate 10 comprising a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

An oxide layer 14, such as silicon dioxide, is formed over bulk silicon substrate 12 to form a pad/protection oxide layer. Such could be formed by any technique, such as thermally oxidizing the outer surface of substrate 12 in a steam ambient at 800° C. to 1100° C. for from one minute to 120 minutes to form a substantially undoped silicon dioxide layer 14 to an exemplary thickness of from 40 Angstroms to 200 Angstroms. Another layer 16 is formed thereover, for instance silicon nitride, by chemical vapor deposition, for example. Collectively, layers 14 and 16 can be considered as a sacrificial masking layer formed as part of semiconductor substrate 10.

Referring to FIGS. 2 and 3, sacrificial masking layer 14/16 has been patterned, preferably to define source/drain areas 20 of substrate 10 and channel areas 18 therebetween. Such also depicts a substrate expanse 22 the majority of which will ultimately constitute field trench isolation, as will become clear in the following description of but one preferred embodiment. Preferred patterning to produce the exemplary FIGS. 2 and 3 construction is by photoresist masking and etch. Layer 16 can be etched substantially selective to underlying oxide layer 14, or completely etched therethrough to the semiconductive material of substrate 12. Lightly doped drain regions 24 are formed within source/drain areas 20 of semiconductive material 12 using patterned sacrificial masking layer 16/14 to mask channel areas 18. Such can of course be formed by implant or other doping methods, for example using phosphorous, arsenic or boron.

Referring to FIGS. 4 and 5, sacrificial anisotropically etched sidewall spacers 25 are formed over the exposed sidewalls of sacrificial masking layer 14/16. Material for spacers 25 might be the same as or different from materials 14 and 16. An exemplary preferred thickness for depositing the layer which produces the anisotropically etched sidewalls is from 100 Angstroms to 200 Angstroms. Thereafter, first trenches or openings 26, 28 are etched into semiconductive material 12 of semiconductor substrate 10, and which includes source/drain area 20. Patterned sacrificial masking layer 14/16 masks channel areas 18 during such etching. Trenches 26, 28 have semiconductive material comprising bases 30 which are received elevationally lower than lightly doped drain regions 24. Any suitable, preferably highly anisotropic, timed etch can be utilized to produce the FIG. 4 depiction. An exemplary depth for trenches/openings 26, 28 relative to an outermost surface of material 12 is from 2,000 Angstroms to 5,000 Angstroms. Preferred openings/trenches 26, 28 are in the form of channels spanning source/drain areas of a plurality of field effect transistors being formed, such as shown in FIG. 5.

Referring to FIG. 6, insulative material 32 is formed within first trenches 26, 28 over bases 30, and preferably on bases 30 as shown. An exemplary and preferred material is high density plasma deposited silicon dioxide from the decomposition of tetraethylorthosilicate (TEOS). By way of example only, alternate materials such as silicon nitride are also of course contemplated. Typically, such provision of insulative material 32 will, at least initially, overfill (not shown) first trenches 26, 28. In the depicted example, such material 32 has been planarized back, preferably by CMP, to selectively stop on the outer surface of sacrificial masking layer 14/16.

Referring to FIG. 7, insulative material 32 has been etched back to leave lower portions 33 of first trenches 26, 28 filled with insulative material 32 while leaving outer portions 34 of trenches 26, 28 open. Portions 33 of trenches 26, 28, and accordingly, insulative material 32 received therein, preferably have a thickness of less than 1000 Angstroms, and more preferably less than 600 Angstroms. An exemplary preferred thickness range is from 300 Angstroms to 600 Angstroms for the material 32 remaining in trenches 26, 28 in FIG. 7. Further in the FIG. 7 illustrated preferred embodiment, such insulative material has a substantially uniform thickness across the openings. Such provides but one exemplary method of forming insulative material within openings 26, 28 to less than completely fill such openings, here for example by depositing insulative material and etching it back. Further in accordance with a preferred aspect and as described, such etching of insulative material 32 occurs in a blanket manner, without using any photoresist masking during the etching.

The exposed semiconductive material surfaces in FIG. 7 are preferably wet cleaned, for example with HF, to remove any remaining oxide and repair any damage to such surfaces.

Referring to FIG. 8, semiconductive elevated source/drain material 36 is formed within upper portions 34 of first openings/trenches 26, 28 over, and on as shown, insulative material 32 received within such openings. An exemplary preferred material 36 is conductively doped polysilicon, for example deposited by chemical vapor deposition. Typically, such would be deposited to overfill the illustrated FIG. 7 openings, and subsequently planarized back by an exemplary polishing or etch back method. In such preferred embodiment, this leaves elevated source/drain material projecting outwardly of first trenches 26, 28 relative to semiconductive material 12.

Referring to FIGS. 9 and 10, a photoresist comprising layer 40 has been deposited and patterned to mask desired active area 41 and expose desired trench isolation area 42. Photoresist comprising masking layer 40 is shown as being formed over sacrificial masking layer 14/16, spacers 25 and elevated source/drain material 36.

Figure 11:
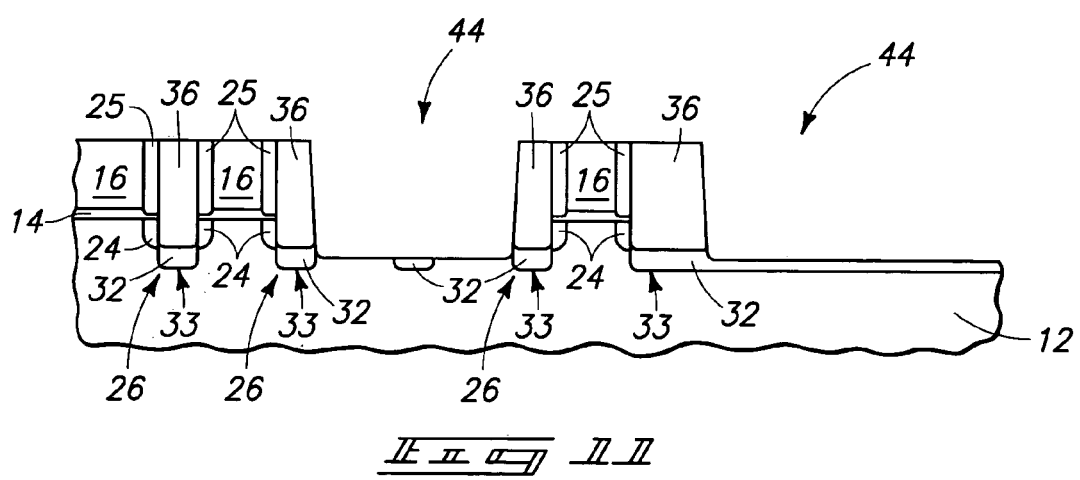
FIG. 11 is a view of the FIG. 9 wafer fragment at a processing step subsequent to that shown by FIG. 9.

Referring to FIG. 11, exposed portions of sacrificial masking layer 14/16, sacrificial spacers 25, elevated source/drain material 36 and semiconductive material 12 of substrate 10 have been etched effective to form isolation trenches 44 within substrate semiconductive material 12 using photoresist comprising masking layer 40, and then such has been removed. The above-described processing provides but one exemplary method of forming active area and field isolation trenches within semiconductive material of a semiconductive substrate. Any suitable etching chemistries, preferably anisotropic chemistries and methods, can be employed to remove the various materials.

Figure 12:
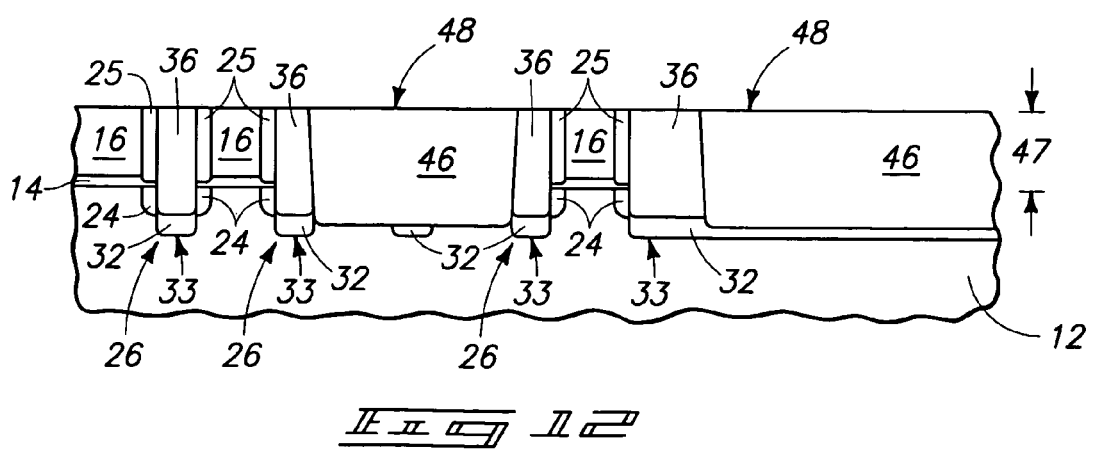
FIG. 12 is a view of the FIG. 11 wafer fragment at a processing step subsequent to that shown by FIG. 11.

Referring to FIG. 12, trenches 44 have been filled with insulative isolation material 46. Such might be the same or different in composition as material 32 therebeneath. Typically and preferably, such formation will be by a deposition which overfills the isolation trenches, followed by a planarizing or polishing etch back to produce the illustrated FIG. 12 construction. Preferably as shown, such will produce isolation material 46 to include portions 47 that project outwardly of isolation trenches 26, 28. Further preferably as shown, projecting portions 47 include outermost planar surfaces 48.

Figure 13:
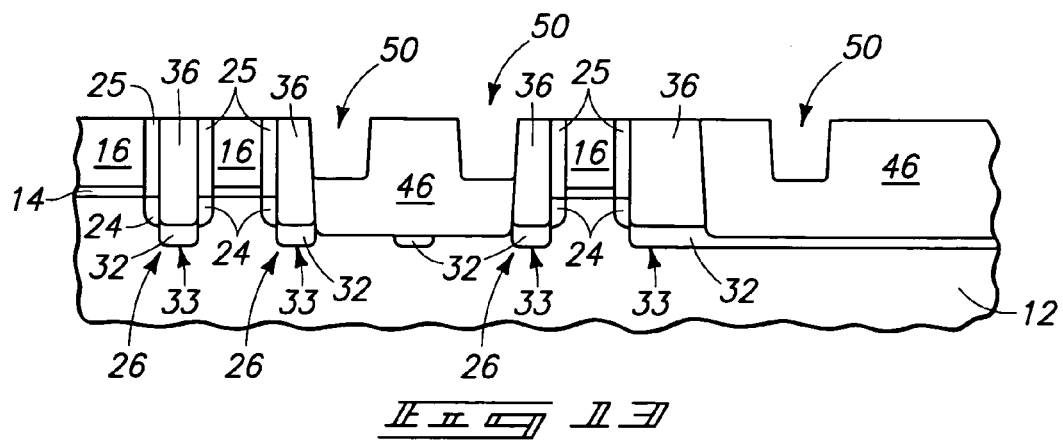
FIG. 13 is a view of the FIG. 12 wafer fragment at a processing step subsequent to that shown by FIG. 12.
Figure 14:
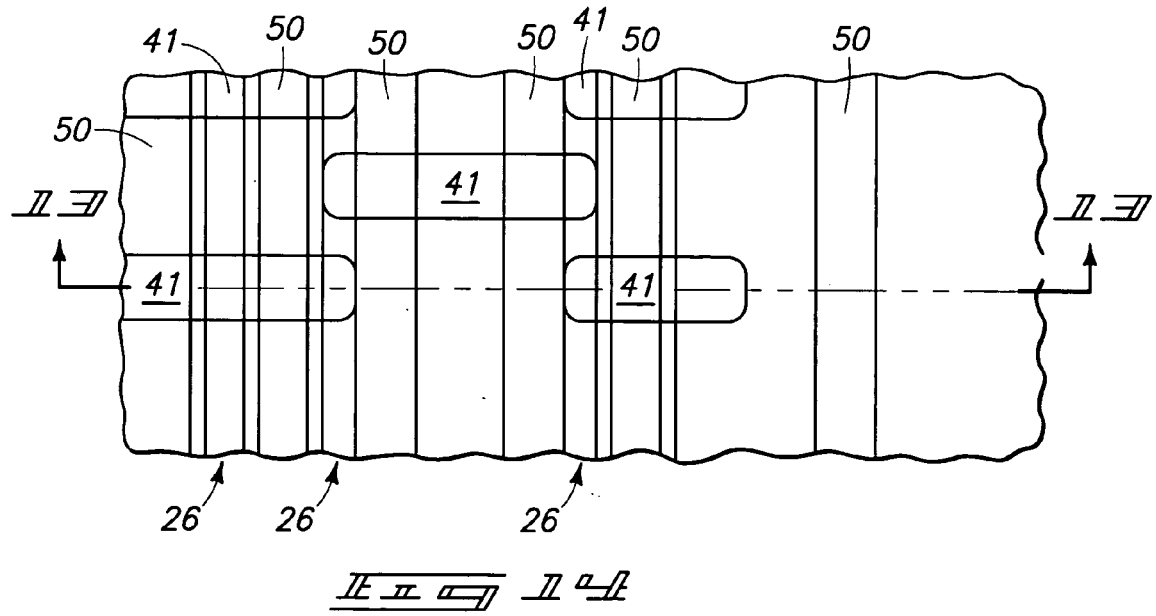
FIG. 14 is a top view of the FIG. 13 wafer fragment.

Referring to FIGS. 13 and 14, a plurality of gate line trenches 50 are etched into outermost planer surfaces 48 into at least those portions 47 of trench isolation material 46 that project outwardly of isolation trenches 44. Preferably, such is conducted by photoresist masking and any suitable anisotropic, timed etch. Trenches 50 are also preferably configured to align relative to sacrificial masking layer 14, 16 for the ultimate formation of transistor gate lines, as will be apparent from the continuing discussion.

Figure 15:
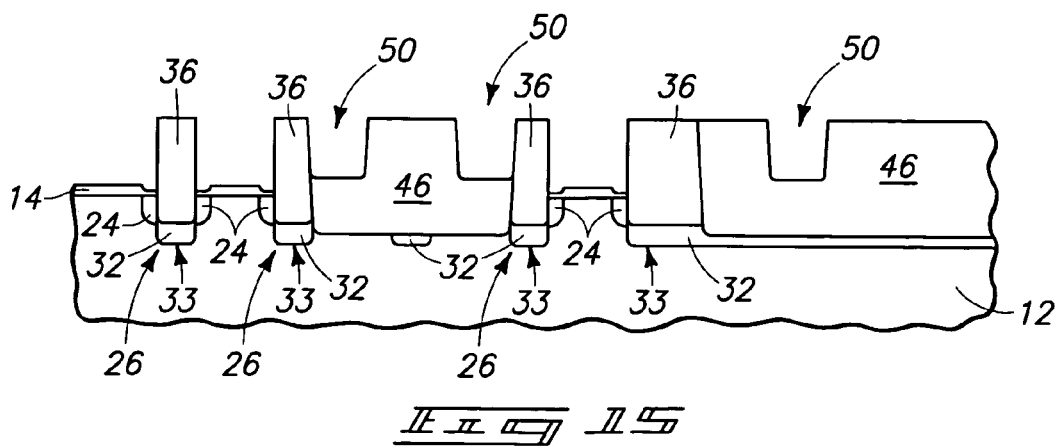
FIG. 15 is a view of the FIG. 13 wafer fragment at a processing step subsequent to that shown by FIG. 13.

Referring to FIG. 15, all remaining portions of sacrificial masking layer 14, 16 have been removed from the substrate, preferably by any suitable etching process or processes.

Figure 16:
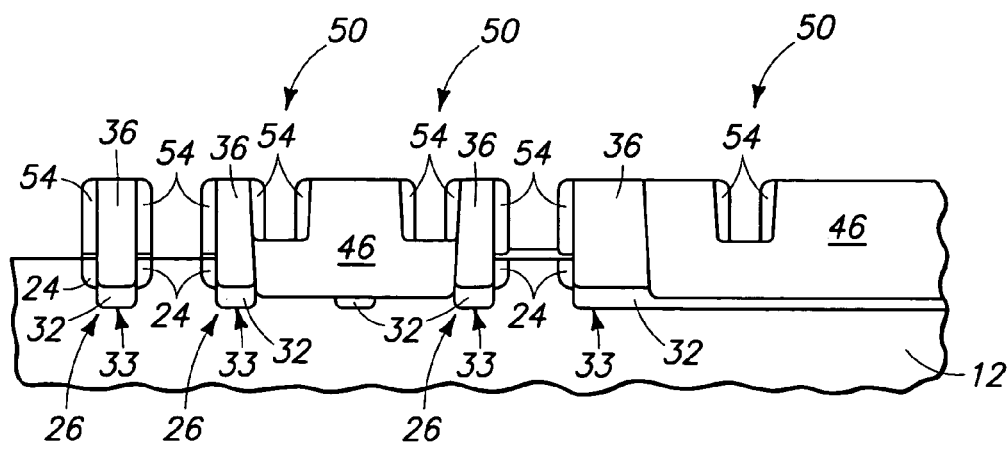
FIG. 16 is a view of the FIG. 15 wafer fragment at a processing step subsequent to that shown by FIG. 15.
Figure 17:
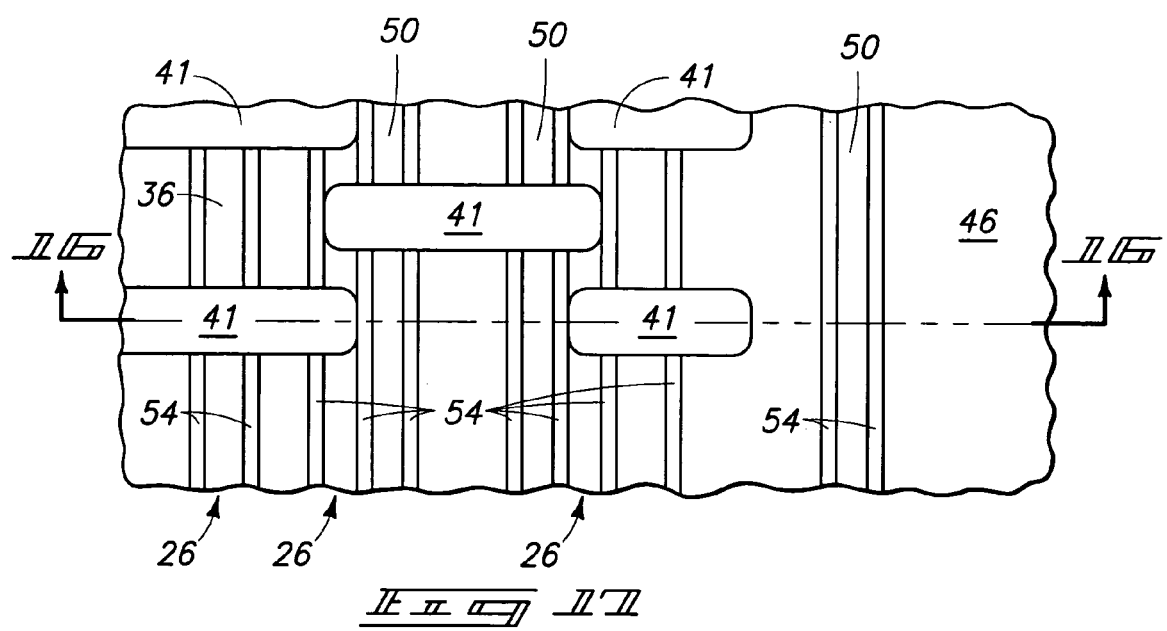
FIG. 17 is a top view of the FIG. 16 wafer fragment.

Referring to FIGS. 16 and 17, anisotropically etched insulative spacers 54 are formed within gate line trenches 50. Exemplary materials include silicon dioxide and silicon nitride. Optimum spacer thickness can be selected based upon anticipated gate induced drain leakage in comparison with desired minimum conductive gate material width.

Figure 18:
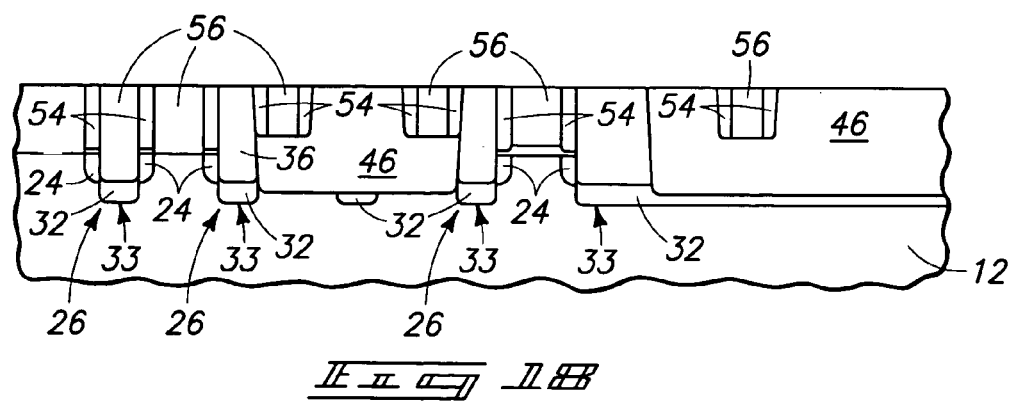
FIG. 18 is a view of the FIG. 16 wafer fragment at a processing step subsequent to that shown by FIG. 16.

Referring to FIG. 18, a first material 56 of a first conductivity has been deposited within gate line trenches 50. An exemplary material is conductively doped polysilicon deposited by CVD, and planarized back by CMP. If complementary p-type and n-type transistors are being fabricated, n+ gate, n+ source/drain, p+ gate and p+ source/drain doping would preferably occur to the FIG. 18 construction. Any desired well implants might be conducted at this point, also, prior to or after the depicted FIG. 18 processing.

Referring to FIG. 19, first material 56 has been partially blanketly etched back within gate line trenches 50. Masked etching of only some of first material 56 could also of course occur, or no etching of any first material 56.

Referring to FIG. 20, a second material 58 of a second conductivity greater than the first conductivity has been formed onto first material 56 within gate line trenches 50. Exemplary preferred materials include refractory metal silicides, such as tungsten silicide, cobalt silicide and nickel silicide. Such could occur by direct CVD of the same, or refractory metal deposition followed by salicidation anneal. Thus in the depicted and described preferred embodiment, conductive portions of the gates are formed from materials 56/58.

Preferably as shown, such forms gates 60 within gate line trenches 50 which have outermost planar conductive surfaces 62 which are coplanar with outermost planar surfaces 48 of projecting portions 47 of insulative isolation material 46. Such also forms the conductive material of gates 60 to have a thickness "A" over immediately underlying material which is greater over active area 41 than a thickness "B" over trench isolation material 46.

Such provides but one example of providing a transistor gate operatively proximate conductive source/drain material 36, and as shown between such material for individual transistors. Such also provides an example where the source/drain material forms preferred elevated source/drains of the field effect transistors being fabricated. Such also provides but one example of forming a transistor gate construction operably over the active area for the field effect transistor, with the gate construction comprising conductive material having an outermost planar surface at least over the active area which is coplanar with that of the trench isolation material.

In accordance with but one aspect of the invention, the above processing describes but one exemplary method of forming a field effect transistor having a conductive gate received over a gate dielectric and having lightly doped drain regions formed within semiconductive material. Such method includes doping the semiconductive material effective to form the lightly doped drain regions prior to forming any conductive gate material for the transistor gate being formed. Of course, any of the above or subsequently-described processing can be conducted relative to both bulk semiconductive material or relative to other semiconductor constructions, for example semiconductor-on-insulator circuitry, as well as any other circuitry, whether existing or yet-to-be developed. Further, unless literally precluded by specific claim language for a claim under analysis, various aspects of the above and below described processing can be conducted with any sort of field isolation, and not limited necessarily to trench field isolation.

In accordance with one preferred aspect of the invention, at least some of the field isolation material is formed after doping to form the lightly doped drain regions, for example the material 46 described above. Further preferably, source/drain material is provided in contact with insulating material thereunder after doping to form the lightly doped drain regions, preferably by depositing such source/drain material. However, the formation of insulative material by other techniques, for example ion implantation, is contemplated also, unless otherwise precluded from claim language of a claim under analysis.

In another considered aspect, the invention constitutes a method of forming a field effect transistor having a conductive gate received over a gate dielectric and having lightly doped drain regions formed within semiconductive material, where the method includes doping the semiconductive material effective to form the lightly doped drain regions prior to forming any gate dielectric material for the transistor gate.

Further in but one aspect of the invention, the invention contemplates a method of forming a field effect transistor having elevated source/drains on a substrate constituting part of a final circuit construction. Such a method includes forming elevated source/drain material of the transistor prior to depositing an outermost portion of trench isolation material received within an isolation trench and constituting a portion of the final circuit construction. By way of example only, an exemplary outermost portion of trench isolation material includes material 46, as initially described in FIG. 12. Further preferably, the trench isolation material is formed by at least two time spaced depositings, for example the depositings to form materials 32 and 46. Further preferably in such method, a later-in-time of the depositings comprises the forming of the outermost portion (i.e., material 46), while an earlier-in-time of the depositings occurs prior to forming the elevated source/drain material (i.e., formation of material/portions 33).

Further by way of example only, the invention contemplates a method of forming a field effect transistor having elevated source/drains on a substrate, which includes forming elevated source/drain material of the transistor prior to the final patterning that defines outlines of the active area and field isolation. By way of example only, such final patterning is depicted in FIGS. 9 and 10 of the above preferred described embodiment. Further preferably, the field isolation is formed to comprise trench isolation, and the elevated source/drain material is formed within openings in the semiconductive material of a semiconductor substrate. Further and in accordance with this aspect, a preferred method includes forming insulative material within the semiconductive material openings prior to forming the elevated source/drain material within the semiconductive material openings.

Further in another preferred aspect with respect to the above, the elevated source/drain material is formed within the openings in the bulk semiconductive material of a bulk semiconductor substrate, as described in connection with the preferred embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming field effect transistors comprising:
    forming a sacrificial masking layer over a semiconductor substrate;
    patterning the sacrificial masking layer effective to mask channel areas of the field effect transistors;
    forming lightly doped drain regions within source/drain areas of the semiconductor substrate using the masking layer to mask the channel areas;
    after forming the lightly doped drain regions, etching first trenches into the source/drain areas of the semiconductor substrate using the patterned sacrificial masking layer to mask the channel areas, the first trenches having semiconductive material comprising bases received elevationally lower than the lightly doped drain regions;
    forming insulative material within and overfilling the first trenches, the insulative material being received on the first trench bases;
    etching back the insulative material to leave lower portions of the first trenches filled with the insulative material while leaving outer portions of the first trenches open;
    forming semiconductive elevated source/drain material within the upper portions of the first trenches, the elevated source/drain material projecting elevationally outward of the first trenches;
    patterning a photoresist comprising masking layer to mask desired active area and expose desired trench isolation area, the photoresist comprising masking layer being formed over the sacrificial masking layer and the elevated source/drain material;
    using the patterned photoresist comprising masking layer, etching exposed portions of the sacrificial masking layer, the elevated source/drain material and semiconductive material of the substrate effective to form isolation trenches within said substrate semiconductive material of the substrate;
    overfilling the isolation trenches with isolation material, the isolation material including portions that project outwardly of the isolation trenches;
    etching a plurality of gate line trenches into at least those portions of the trench isolation material that project outwardly of the isolation trenches;
    after etching the plurality of gate line trenches, removing all remaining of the sacrificial masking layer from the substrate; and
    after the removing, forming conductive gate material within the gate line trenches and over the active area.

2. The method of claim 1 wherein the semiconductive material comprises bulk semiconductive material of a bulk semiconductor substrate.

3. The method of claim 1 wherein the projecting portions include outermost planar surfaces into which the gate line trenches are etched.

4. The method of claim 1 wherein the projecting portions include outermost planar surfaces into which the gate line trenches are etched, gates formed within the gate line trenches having outermost planar conductive surfaces which are coplanar with the outermost planar surfaces of the projecting portions.

5. The method of claim 1 wherein the forming of conductive gate material within the gate line trenches comprises depositing a first material of a first conductivity within the gate line trenches, etching the first material back within the gate line trenches, and forming a second material of a second conductivity greater than the first conductivity onto the first material within the gate line trenches.

6. The method of claim 5 wherein the projecting portions include outermost planar surfaces into which the gate line trenches are etched, the second material having planar outermost conductive surfaces which are coplanar with the outermost planar surfaces of the projecting portions.

7. The method of claim 1 wherein the conductive gate material has thickness over immediately underlying material, said thickness being greater over the active area than over the trench isolation material.

8. The method of claim 1 comprising forming sacrificial anisotropically etched sidewall spacers over exposed sidewalls of the sacrificial masking layer after forming the lightly doped drain regions and before etching the first trenches, and etching the sacrificial anisotropically etched sidewall spacers from the substrate prior to forming the conductive gate material.

9. The method of claim 1 comprising prior to patterning the photoresist comprising masking layer, planarizing the elevated source/drain material relative to the sacrificial masking layer.

* * * * *

UNITED STATES PATENT AND TRADEMARK OFFICE
CERTIFICATE OF CORRECTION

| | | |
|---|---|---|
| PATENT NO. | : 6,936,507 B2 | Page 1 of 1 |
| APPLICATION NO. | : 11/001145 | |
| DATED | : August 30, 2005 | |
| INVENTOR(S) | : Tang et al. | |

It is certified that error appears in the above-identified patent and that said Letters Patent is hereby corrected as shown below:

Col. 5, line 46, please delete "planer" after "outermost" and insert --planar--.

Signed and Sealed this

Eighteenth Day of July, 2006

JON W. DUDAS
*Director of the United States Patent and Trademark Office*